(12) United States Patent
Butler

(10) Patent No.: US 10,446,068 B2
(45) Date of Patent: Oct. 15, 2019

(54) VEHICLE MESSAGING SYSTEM

(71) Applicant: Andrew L. Butler, Brooklyn, NY (US)

(72) Inventor: Andrew L. Butler, Brooklyn, NY (US)

( * ) Notice: Subject to any disclaimer, the term of this patent is extended or adjusted under 35 U.S.C. 154(b) by 0 days.

(21) Appl. No.: 15/610,478

(22) Filed: May 31, 2017

(65) Prior Publication Data

US 2018/0158384 A1  Jun. 7, 2018

Related U.S. Application Data

(60) Provisional application No. 62/343,751, filed on May 31, 2016.

(51) Int. Cl.

| | | |
|---|---|---|
| G06F 21/04 | (2006.01) | |
| H05K 7/20 | (2006.01) | |
| H05K 5/03 | (2006.01) | |
| H05K 5/02 | (2006.01) | |
| B60R 13/10 | (2006.01) | |
| G09F 9/30 | (2006.01) | |
| G08B 13/00 | (2006.01) | |
| H05K 5/00 | (2006.01) | |
| G09F 21/04 | (2006.01) | |
| G09F 27/00 | (2006.01) | |
| G06Q 30/02 | (2012.01) | |
| G09F 7/18 | (2006.01) | |

(52) U.S. Cl.
CPC ............ *G09F 21/048* (2013.01); *B60R 13/10* (2013.01); *G06Q 30/0265* (2013.01); *G08B 13/00* (2013.01); *G09F 9/30* (2013.01); *G09F 27/00* (2013.01); *H05K 5/0017* (2013.01); *H05K 5/0213* (2013.01); *H05K 5/03* (2013.01); *H05K 7/20954* (2013.01); *G09F 2007/1895* (2013.01)

(58) Field of Classification Search
CPC ....... G09F 21/048; G09F 9/30; H05K 5/0017; H05K 5/03; H05K 7/20954; H05K 5/0213; B60R 13/10; G08B 13/00
See application file for complete search history.

(56) References Cited

U.S. PATENT DOCUMENTS

| | | | |
|---|---|---|---|
| 6,404,327 | B1 | 6/2002 | Naddeo |
| 7,760,080 | B2 * | 7/2010 | Breed ................. B60C 23/0433 340/444 |
| 8,656,165 | B2 | 2/2014 | Longobardi et al. |
| 9,734,744 | B1 * | 8/2017 | McGie ..................... G09G 3/14 |
| 2002/0009978 | A1 * | 1/2002 | Dukach ................ G06Q 30/02 455/99 |
| 2002/0164962 | A1 * | 11/2002 | Mankins ............ A61K 38/2221 455/99 |
| 2007/0112762 | A1 * | 5/2007 | Brubaker .......... G06F 17/30867 |

(Continued)

FOREIGN PATENT DOCUMENTS

| | | | | |
|---|---|---|---|---|
| EP | 1541420 B1 * | 9/2006 | ............. | B60R 13/10 |
| WO | WO 2017180900 A1 * | 10/2017 | ............. | B60R 13/10 |

*Primary Examiner* — Adnan Aziz
(74) *Attorney, Agent, or Firm* — Stuart M. Goldstein

(57) ABSTRACT

A vehicle messaging system is provided. The vehicle messaging system includes a message panel configured to join the vehicle. The message panel includes a secondary power source in addition to the primary power source provided by the vehicle. The message panel includes a thermostat, a heating portion, and a cooling portion that together maintain the message panel at a pre-determined temperature. The message panel also includes alert systems, protection panels, and an image capturing device.

20 Claims, 12 Drawing Sheets

(56) References Cited

U.S. PATENT DOCUMENTS

| | | | |
|---|---|---|---|
| 2008/0051996 A1 | 2/2008 | Dunning et al. | |
| 2008/0231067 A1* | 9/2008 | Nagle | B60P 3/07 296/50 |
| 2011/0295697 A1* | 12/2011 | Boston | B60Q 1/503 705/14.68 |
| 2012/0044429 A1* | 2/2012 | Guerra | F16M 11/041 348/837 |
| 2013/0231828 A1* | 9/2013 | Seal | G09F 19/18 701/36 |
| 2014/0249713 A1 | 9/2014 | Davis | |
| 2015/0194082 A1* | 7/2015 | McEwan | G09F 21/048 40/209 |
| 2015/0266421 A1* | 9/2015 | Brubaker | B60R 1/00 348/148 |
| 2015/0282346 A1* | 10/2015 | Ganim | H05K 5/0204 361/807 |
| 2016/0139582 A1* | 5/2016 | Matsuoka | G05D 23/1917 700/276 |
| 2017/0111960 A1* | 4/2017 | Arafa | H05B 3/36 |

* cited by examiner

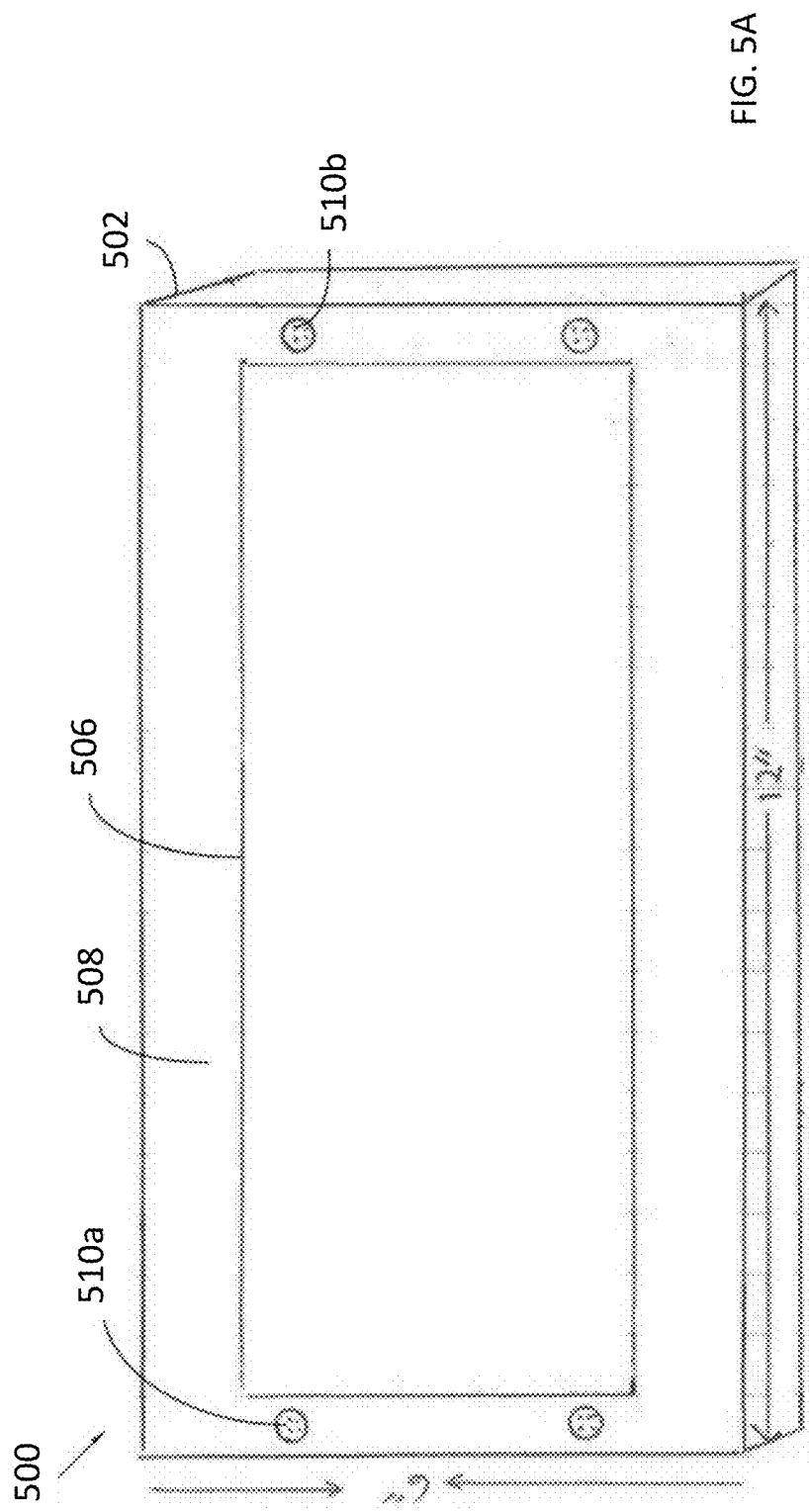

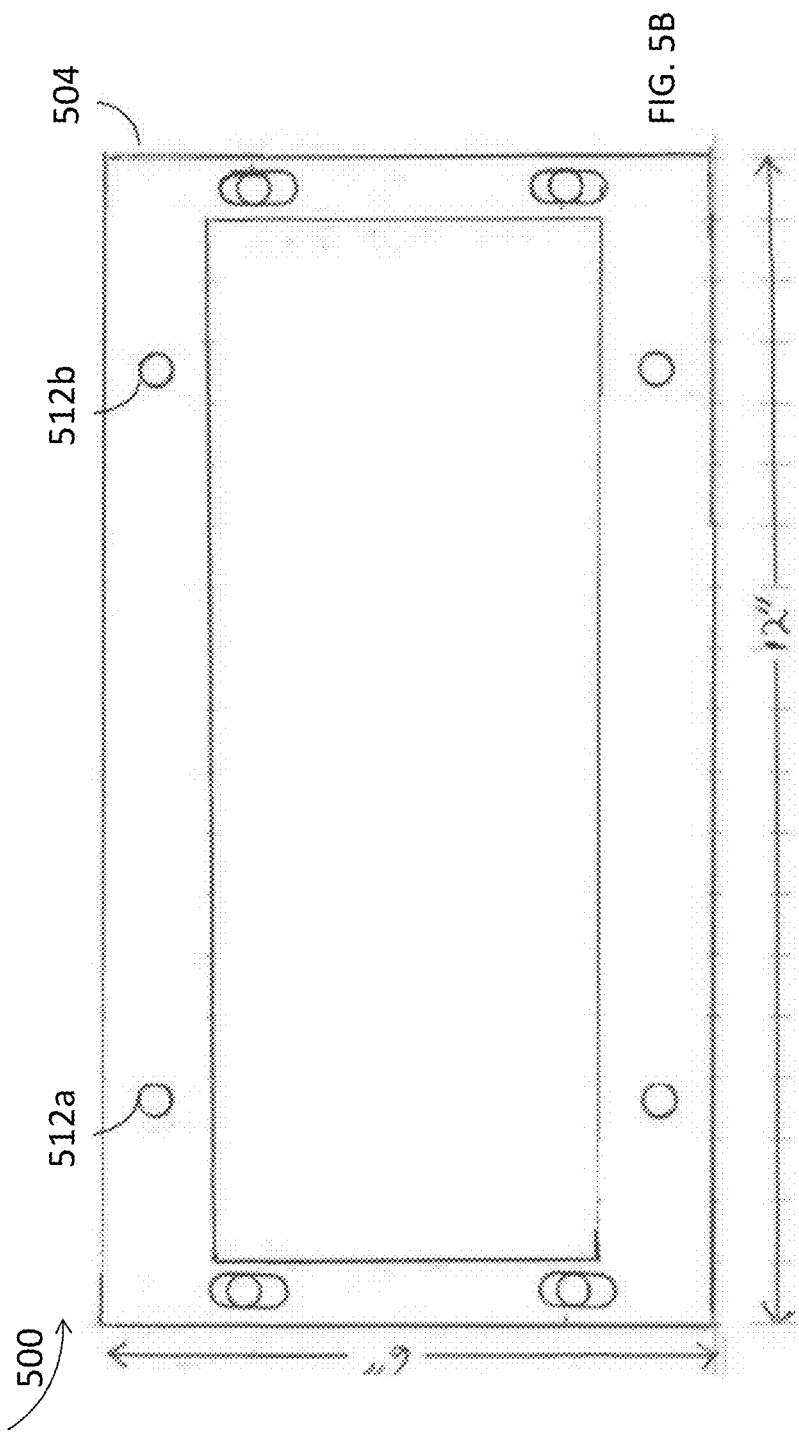

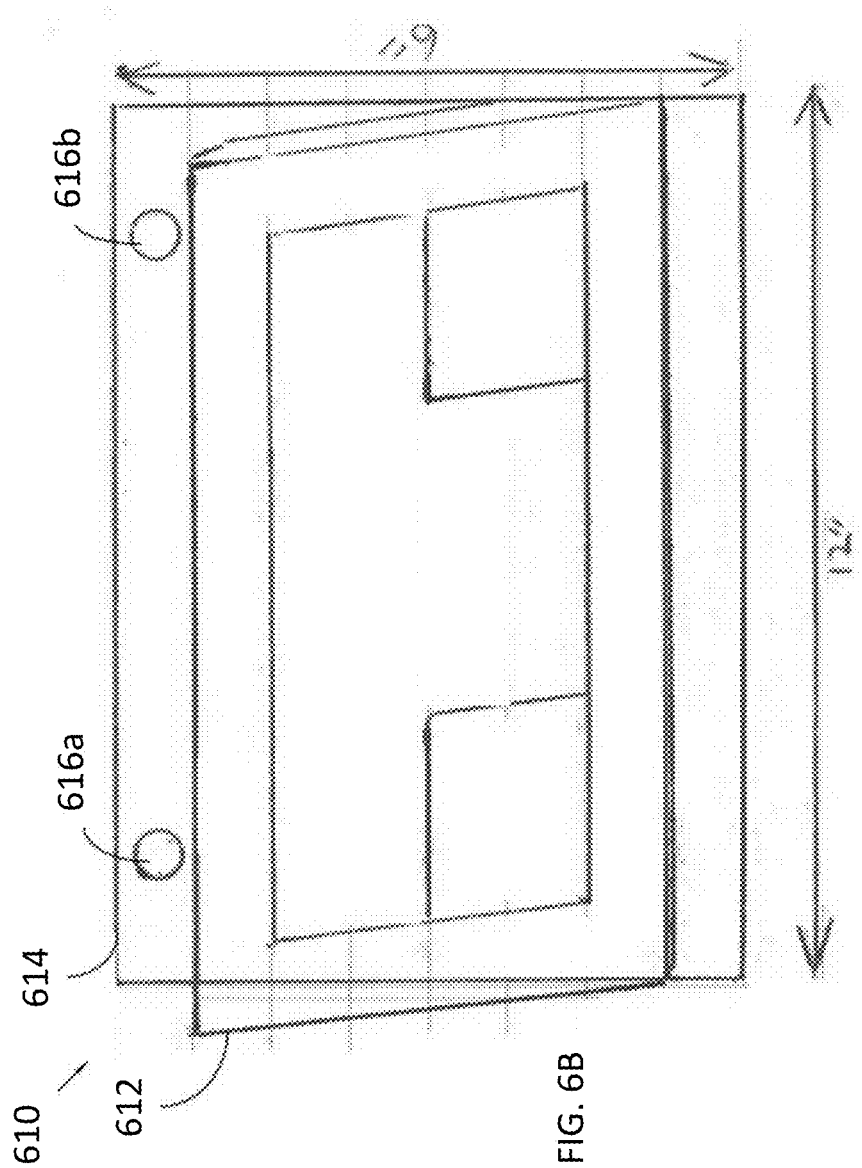

VEHICLE MESSAGING SYSTEM

CROSS-REFERENCE TO RELATED APPLICATIONS

The present Utility patent application claims priority benefit of the U.S. provisional application for patent Ser. No. 62/343,751 entitled "VEHICLE MESSAGING SYSTEM" filed May 31, 2016 under 35 U.S.C. 119(e). The contents of this related provisional application are incorporated herein by reference for all purposes to the extent that such subject matter is not inconsistent herewith or limiting hereof.]

COPYRIGHT NOTICE

A portion of the disclosure of this patent document contains material that is subject to copyright protection by the author thereof. The copyright owner has no objection to the facsimile reproduction by anyone of the patent document or patent disclosure for the purposes of referencing as patent prior art, as it appears in the Patent and Trademark Office, patent file or records, but otherwise reserves all copyright rights whatsoever.

BACKGROUND OF THE RELEVANT PRIOR ART

One or more embodiments of the invention generally relate to a vehicle messaging system. More particularly, certain embodiments of the invention relate to a vehicle messaging system which employs a digital license plate that includes temperature control and backup power features.

The following background information may present examples of specific aspects of the prior art (e.g., without limitation, approaches, facts, or common wisdom) that, while expected to be helpful to further educate the reader as to additional aspects of the prior art, is not to be construed as limiting the present invention, or any embodiments thereof, to anything stated or implied therein or inferred thereupon. The following is an example of a specific aspect in the prior art that, while expected to be helpful to further educate the reader as to additional aspects of the prior art, is not to be construed as limiting the present invention, or any embodiments thereof, to anything stated or implied therein or inferred thereupon. By way of educational background, another aspect of the prior art generally useful to be aware of is that digital license plates in literature and those available in market typically provide various features including security from theft, communication of possible theft to government agencies, etc. however, it is believed that the digital license plates are typically powered by the vehicle and may not function when the vehicle is in a "stop" mode. Further one can expect the digital license plates to fail or malfunction in extreme weather conditions due to over heating or over cooling.

In view of the foregoing, it is clear that these traditional techniques are not perfect and leave room for more optimal approaches.

BRIEF DESCRIPTION OF THE DRAWINGS

The present invention is illustrated by way of example, and not by way of limitation, in the figures of the accompanying drawings and in which like reference numerals refer to similar elements and in which:

FIGS. 5A and 5B illustrate front views of an exemplary first enclosure portion for retaining a message panel, where FIG. 5A illustrates a first front panel, and FIG. 5B illustrates a first rear panel, in accordance with an embodiment of the present invention;

FIGS. 6A and 6B illustrate front views of two different enclosure designs for retaining a message panel, where FIG. 6A illustrates a second front panel, and FIG. 6B illustrates a second rear panel, in accordance with an embodiment of the present invention;

Unless otherwise indicated illustrations in the figures are not necessarily drawn to scale.

DETAILED DESCRIPTION OF SOME EMBODIMENTS

The present invention is best understood by reference to the detailed figures and description set forth herein.

Embodiments of the invention are discussed below with reference to the Figures. However, those skilled in the art will readily appreciate that the detailed description given herein with respect to these figures is for explanatory purposes as the invention extends beyond these limited embodiments. For example, it should be appreciated that those skilled in the art will, in light of the teachings of the present invention, recognize a multiplicity of alternate and suitable approaches, depending upon the needs of the particular application, to implement the functionality of any given detail described herein, beyond the particular implementation choices in the following embodiments described and shown. That is, there are modifications and variations of the invention that are too numerous to be listed but that all fit within the scope of the invention, While a non-transitory computer readable medium includes, but is not limited to, a hard drive, compact disc, flash memory, volatile memory, random access memory, magnetic memory, optical memory, semiconductor based memory, phase change memory, optical memory, periodically refreshed memory, and the like; the non-transitory computer readable medium, however, does not include a pure transitory signal per se; i.e., where the medium itself is transitory.

It is to be understood that any exact measurements/dimensions or particular construction materials indicated herein are solely provided as examples of suitable configurations and are not intended to be limiting in any way. Depending on the needs of the particular application, those skilled in the art will readily recognize, in light of the following teachings, a multiplicity of suitable alternative implementation details.

There are various types of digital license plates that may be provided by preferred embodiments of the present invention. In one embodiment of the present invention, a vehicle messaging system may be configured to store and transmit at least one message from a display. The message may be associated with a vehicle or a vehicle operator. The system may include a message panel, such as a digital license plate, that joins with a portion of the vehicle.

Figure 1:
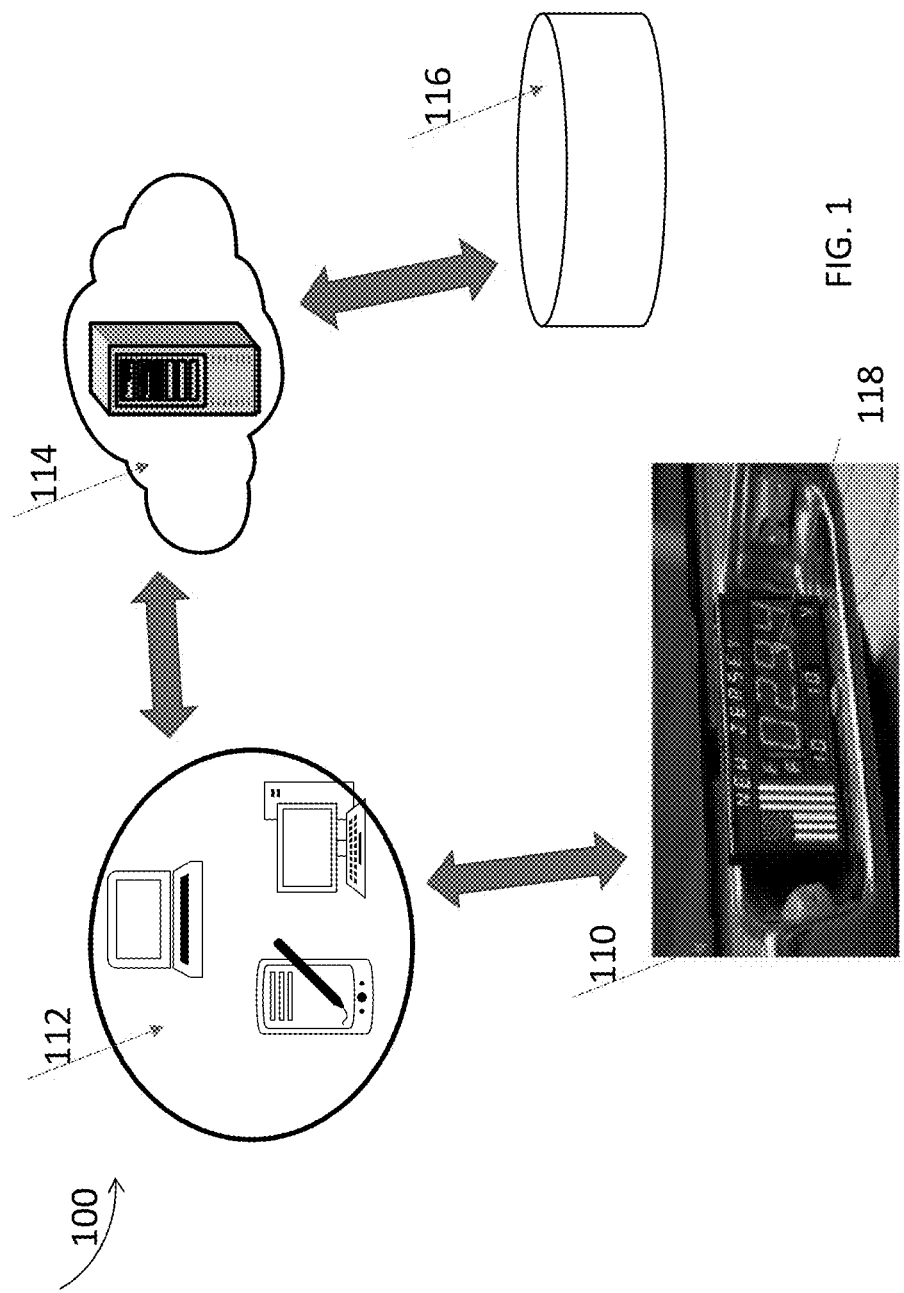
FIG. 1 illustrates an exemplary vehicle messaging system, in accordance with an embodiment of the present invention.

Referring to FIG. 1, is illustrated an exemplary vehicle messaging system, in accordance with an embodiment of the present invention. The vehicle messaging system may include at least a message panel 110, at least a control portion 112, at least a server 114, and at least a database 116.

The message panel 110 may comprise a display interface 118 that may display at least one message related to a vehicle or a vehicle operator as described herein below. A control portion 112 may be virtually any device or devices capable of receiving a message from and/or sending a message to the message panel 110, as well as sending/receiving a message to/from a server 114. Server 114 may be any computing platform that executes computer software and/or code from a non-transitory computer readable medium. Server 114 may also access a database 116 containing messages and solutions or information required to be provided in relation to the messages. In some embodiments, system 100 may comprise two or more message panels 110, two or more control portions 112, two or more servers 114 with databases 116. In some embodiments, control portion 112 may communicate one or more messages to two or more servers 114. In a non-limiting example, control portion 112 may communicate one or more messages to multiple servers 114 and may polls the servers 114 to determine which server may respond with response messages or solutions to the messages. In some embodiments, message panel 110 may capture images from its vicinity and communicate the images to one or more control portions 112, to one or more servers 114, or to one or more severs 114 via one or more control portion 112. In some alternate embodiments, message panel 110 may capture a plurality of images from its vicinity and communicate the images in a batch mode. In other alternate embodiments, message panel 110 may capture a plurality of images from its vicinity and communicate the images in a serial mode. As a non-limiting example, message panel 110, may communicate the images as soon as they are captured. As a non-limiting example a message panel 110 may be a digital license plate, or a digital sign board. It may be appreciated by a person with ordinary skill in the art, in light of and in accordance with the teachings of the present invention, a message panel 110 may be virtually any electronic device capable of having a display interface 118. Message panel 110 may include, but may not limited to, digital license plates, digital sign boards, etc.

It may be appreciated by a person with ordinary skill in the art, in light of and in accordance with the teachings of the present invention, that the message panel 110 may connect to any number of devices with virtually any wired and/or wireless means. Message panel 110 may connect to virtually any device by means such as, but not limited to, Bluetooth connection, Ethernet cable, USB cable, WIFI, IRDA, etc. In an alternative embodiment of the present invention, a message panel 110 may send additional messages to a server 114 and/or control portion 112 via a cellular connection.

It may be appreciated by a person with ordinary skill in the art, in light of and in accordance with the teachings of the present invention, a server 114 may be virtually any computing platform such as, but not limited to, a computer cluster, a laptop, a tablet, a smartphone, a web/cloud platform, etc . . . .

It may be appreciated by a person with ordinary skill in the art, in light of and in accordance with the teachings of the present invention that, a database 116 may be virtually any data storage device or devices. Database 116 may be, but not limited to, a plurality of data servers, a memory card. In another embodiment of the present invention, database 116 may be a memory card connected to server 114 or to the control portion 112.

It may be appreciated by a person with ordinary skill in the art, in light of and in accordance with the teachings of the present invention, that database 116 may contain virtually any data to improve the functionality of the vehicle messaging system 100. Database 116 may include, without limitation, driver information, driver license information, weather information, theft information, road work information, route information, route change information, medical facility information, consumer product information for mass media advertisement and the like.

It may be appreciated by a person with ordinary skill in the art, in light of and in accordance with the teachings of the present invention, vehicle messaging system 100 may partially or completely be contained in a local computing platform and/or network, i.e., the control portion 112.

Figure 2:
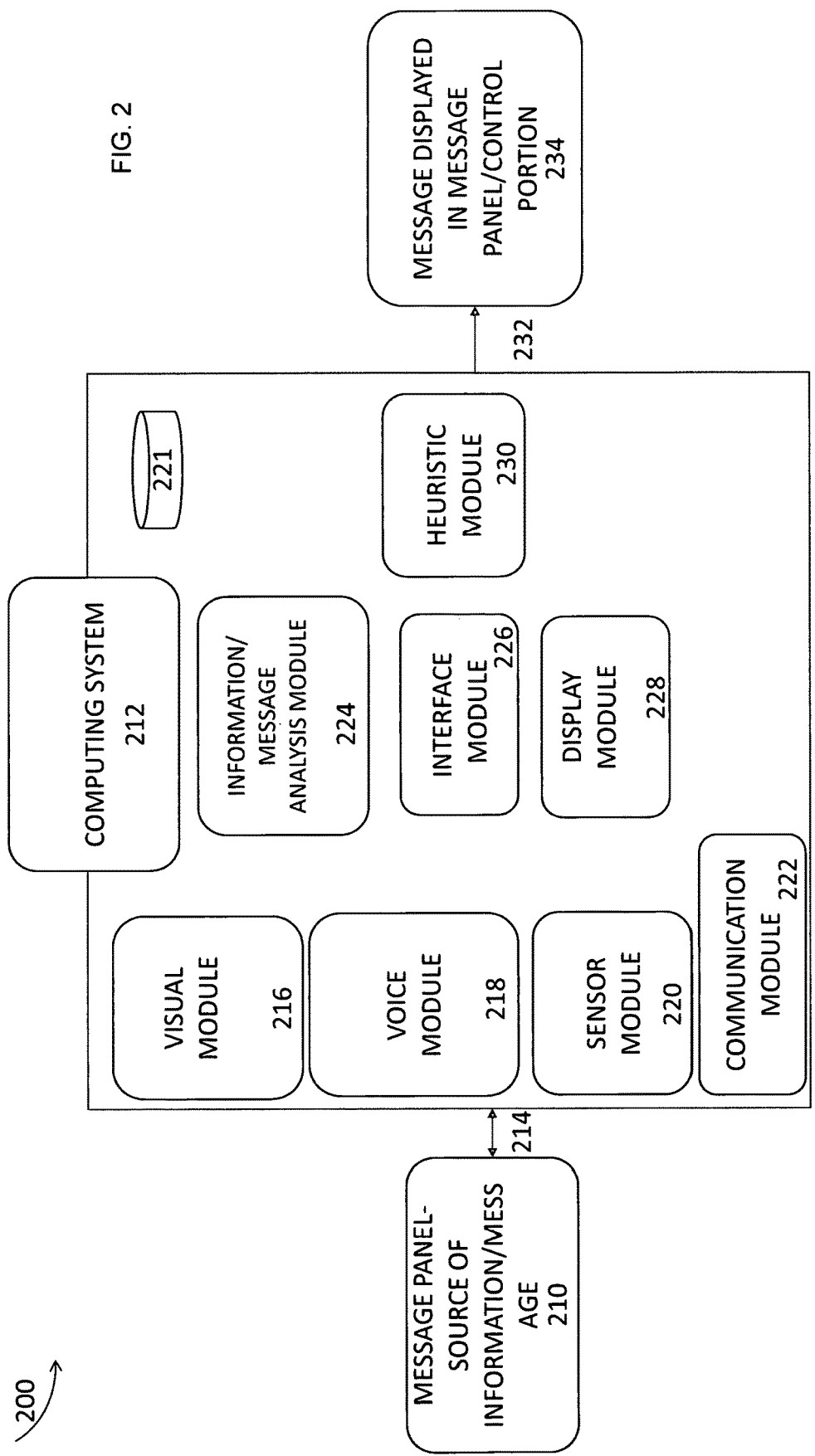
FIG. 2 illustrates an architecture of an exemplary vehicle messaging system, in accordance with an embodiment of the present invention.

Referring to FIG. 2 is illustrated an architecture of an exemplary vehicle messaging system, in accordance with an embodiment of the present invention. A vehicle messaging system architecture 200 may comprise a computing system 212 included in a message panel 110 and/or a control portion 112, i.e., computer. The computing system 212 may include a visual module 216, a voice module 218, a sensor module 220, a communication model 222, an information/message analysis module 224, a display module 228, an interface module 226, and a heuristic module 230. Visual module 216 may have a means of receiving a visual input, processing the visual input, and providing a visual input/output such as, without limitation, a processing unit, a computer, or a server 114 to execute computer code and/or algorithms from a non-transitory computer readable medium for a message 210 received 214 from a message panel. Voice module 218 may have a means of receiving a voice input, processing the voice input, and providing a voice input/output such as, without limitation, a processing unit, a computer, or a server 110 to execute computer code and/or algorithms from a non-transitory computer readable medium for a message 210 received 214 from a message panel. A sensor module 220 may have a means of receiving sensor information from sensors included in the message panel, such as, without limitation, a processing unit, a computer, or a server 110 to execute computer code and/or algorithms from a non-transitory computer readable medium for a message 210 received 214 from a message panel. A communication module 222 may have a means of receiving a communication, processing the communication, and sending a communication, such as, without limitation, a processing unit, a computer, or a server 114 to execute computer code and/or algorithms from a non-transitory computer readable medium for a message 210 received 214 from a message panel and a message 234 sent 232 to the message panel/control portion. A database 221 may have a means of storing the data on the patient, test results of the patient provided by the various sensors, such as, without limitation, a processing unit, a computer, or a server 114 to execute computer code and/or algorithms from a non-transitory computer readable.

In one embodiment, the database 221 may be as described herein above with reference to FIG. 1. An interface module 226 may have a means of interfacing with the various modules, for example, the sensor module 220, the communication module 222, and the message analysis module 224, and the database 221, such as, without limitation, a processing unit, a computer, or a server 114 to execute computer code and/or algorithms from a non-transitory computer readable medium, and may provide a combined response message to be displayed using the display module 228 on the message panel, and provide interface support to assist the vehicle messaging system in performing its various functions. A display module 228 may have a means of displaying an image, for example, image of the driver's license plate, driver license information, advertisements, visual representation of weather conditions, and the like. A heuristic module 230 may have a means of self-learning, such as, without limitation, a processing unit, a computer, or a server 114 to execute computer code and/or algorithms from a non-transitory computer readable medium, to assist the assimilation of various messages sent by the message panel and may provide a combined response message to be displayed using the display module 228 on the message panel.

It may be appreciated by a person with ordinary skill in the art, in light of and in accordance with the teachings of the present invention, that one or more modules may be embodied in a single device. In an alternative embodiment of the present invention, all modules except the message analysis module may be embodied in a message panel 110. For example, the message panel may be capable of capturing an image in its vicinity, such as an image of the license plate of a vehicle in its vicinity in the event of an accident, and send this message to a control portion 112. The control portion 112 in communication with the server 114 and or database 116 may then analyze the details using the message analysis module 224 and send an appropriate response message to the vehicle driver. The response message may either be displayed in the display interface 118 or be displayed in the control portion 112. A driver and/or agency may respond after viewing information displayed on the digital license plate. It may be appreciated by a person with ordinary skill in the art, in light of and in accordance with the teachings of the present invention, that virtually any algorithm and/or computer code may be used to recognize a visual on the voice module 218. Voice recognition algorithms and/or methods may include, without limitation, Bayesian networks, fuzzy logic, neural networks, template matching, Hidden Markov models, machine learning, data mining, feature extraction and data analysis/statistics, optical character recognition, etc. In an alternative embodiment of the present invention, a binary search tree may be implemented to extra data from a voice.

It may be appreciated by a person with ordinary skill in the art, in light of and in accordance with the teachings of the present invention, that virtually any algorithm and/or computer code may be used to recognize a visual on the visual module 216. Visual recognition algorithms and/or methods may include, without limitation, Bayesian networks, fuzzy logic, neural networks, template matching, Hidden Markov models, machine learning, data mining, feature extraction and data analysis/statistics, optical character recognition, etc. In an alternative embodiment of the present invention, a binary search tree may be implemented to extra data from a visual.

It may be appreciated by a person with ordinary skill in the art, in light of and in accordance with the teachings of the present invention, that there may be a plurality of the same modules in the vehicle messaging system architecture 200. A plurality of modules such as, without limitation, a visual module 216, a voice module 218, a sensor module 220, a communication model 222, an information/message analysis module 224, a display module 228, an interface module 226, and a heuristic module 230, may be present in the vehicle messaging system architecture 200. The plurality of similar modules may work in parallel or independently to improve the throughput and/or speed of the vehicle messaging system architecture 200. In an alternative embodiment of the present invention, a plurality of communication, sensor etc. . . . modules may be connected to a vehicle messaging system via wired and wireless connections to access resources from different wired and wireless networks. In still another alternative embodiment of the present invention, a plurality of similar modules may form a secondary vehicle messaging system capable of seamlessly substituting a messing and/or failing module.

It may be appreciated by a person with ordinary skill in the art, in light of and in accordance with the teachings of the present invention, that one or more modules may transmit module failure to a tech support server that is on an accessible network or over the internet. In an alternative embodiment of the present invention, sensor information and vehicle driver may be sent to a server to alleviate processing load on a vehicle messaging system.

It may be appreciated by a person with ordinary skill in the art, in light of and in accordance with the teachings of the present invention, that any module in vehicle messaging system architecture 200 may perform data manipulation. Data manipulation such as, but not limited to, compression, encryption, formatting. In an alternative embodiment of the present invention, any module sending data may first compress the data prior to data transmission.

Figure 3:
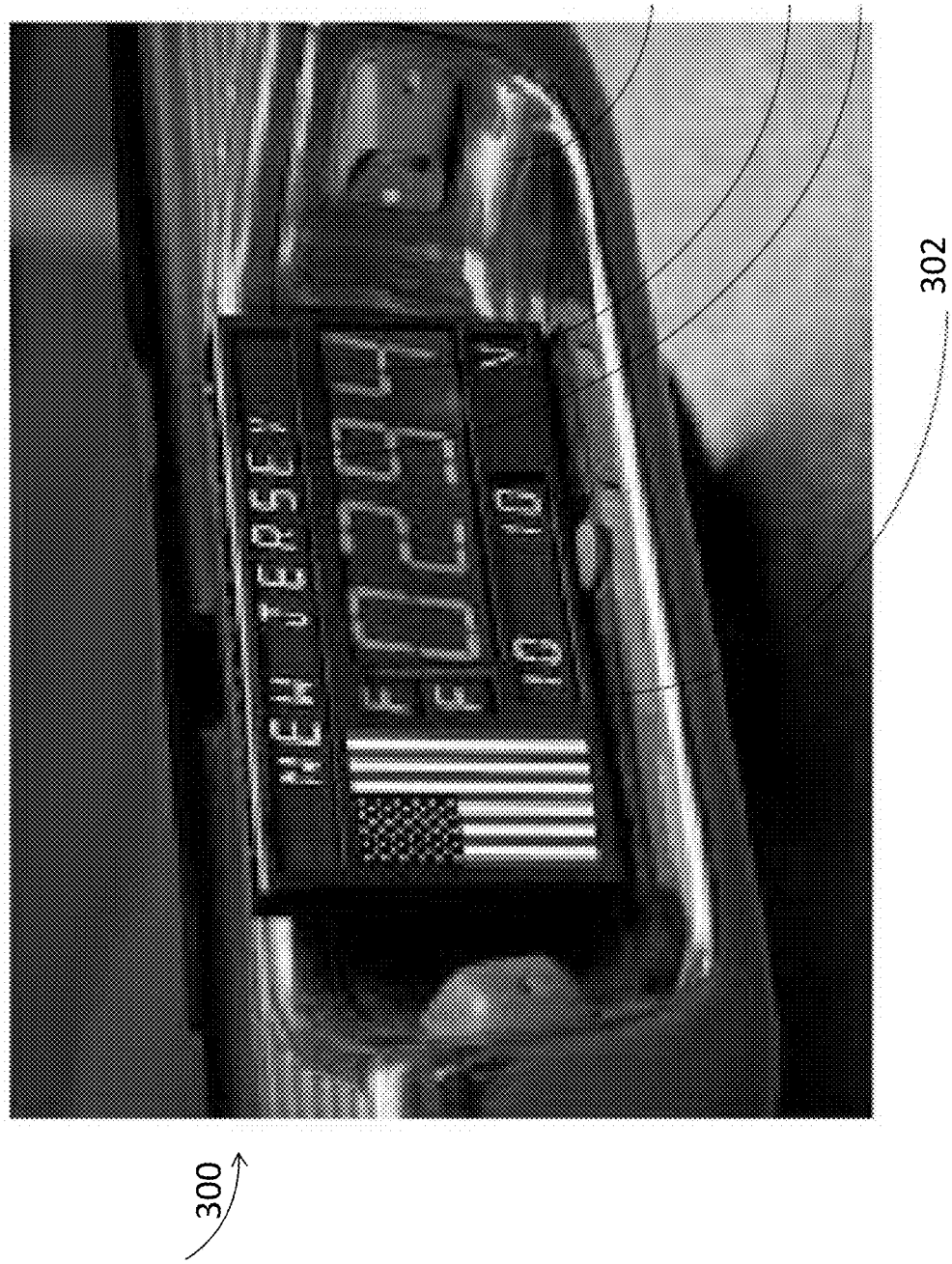
FIG. 3 illustrates an exemplary message panel with a message, in accordance with an embodiment of the present invention

Referring to FIG. 3 is illustrated an exemplary message panel having at least one message in accordance with an embodiment of the present invention. In one aspect, a messaging system 300 may be configured to store, display, and transmit at least one message 304a, 304b associated with a vehicle 306 or a vehicle operator. The messaging system may utilize a message panel 302 that may join or be operably coupled with the vehicle 306. The message panel may include the electrical, visual, and digital components necessary for the efficient display, reception, and transmission of an appropriate, and constantly changing real time message from a vehicle.

In one embodiment, the message panel may include a digital screen, LCD, or similar digital screen technology. In one exemplary embodiment, the message panel may utilize an LCD, an LED backlight, a full high definition i.e., a 1080p resolution. In one embodiment, the message panel may also utilize an anti-glare coating or anti-glare material to inhibit glare on the message panel. This feature may enhance the visibility of the message.

In one exemplary embodiment, the message panel may be generally rectangular and have dimensions of about 12 inches×6 inches. It may be appreciated by a person with ordinary skill in the art, in light of and in accordance with the teachings of the present invention, that other shapes and sizes may be used depending on where the message panel is being used. The message panel may be similar in size and shape to the license plates currently used on vehicles. In one embodiment, the message plate may be installed where a vehicle license plate is typically located on a vehicle. In some embodiments, the message panel may be located on other locations on a vehicle such as the car door, corner of the windshield or on the back of the side mirrors. In some embodiments, the message plate may be located on a motorized or an engine driven vehicle, or on other mobile or non-mobile source, and the like.

It may be appreciated by a person with ordinary skill in the art, in light of and in accordance with the teachings of the present invention, that the message plate may be made using any appropriate material, for example, materials capable of withstanding an high impact from another vehicle and/or object, capable of withstanding various environmental conditions, a security grade material, etc. . . . . . Accordingly, suitable materials for the message panel may include, without limitation, a metal, for example, aluminum; polymer, for example, polyvinyl chloride (PVC), polycarbonate; a composite material, for example, fire reinforced plastics (FRP), and the like.

In some embodiments, the message panel may be configured to include amber alerts, silver alerts, mass consumer product advertising In one embodiment, the message may be dynamic i.e., constantly evolving in real time. In some embodiments, the message may include alerts, advertisements, and public service messages that may be effective when displayed on a vehicle. For example, messages that may be displayed by the message panel may include, but not be limited to, a required state DMV information, important public notifications, i.e., amber alerts, silver alerts, stolen car alerts, wanted persons alert, flash weather alerts, and the like. It may also include some sensors in the vehicle that may provide of an emergency health status of the driver, so other drivers may be made aware the there is an issue, and the alert may be sent to 911.

As shown in FIG. 3, the message from the message panel may be digitally displayed on the message panel. However, in other embodiments, the message may be encrypted and viewable only through a control portion 112. The control portion may include a reading device that receives and interprets the message from the message panel. Various information receivers may utilize the control portion for this purpose, including, without limitation, law enforcement officials, medical personnel, highway safety personnel, mechanics, insurance companies, the vehicle operator, and an authorized person. In one embodiment, the control portion 112 may include a computing system 212 employed by the various information receivers. The control portion 112 may include a computer, a mobile phone, a smart phone, a hand held, a laptop, a smart watch, and like devices.

In some embodiments, the at least one message may include, without limitation, a license plate number, a driver's license number, vehicle insurance information, a vehicle inspection record, medical records of the vehicle operator, medical records of any other user travelling in the vehicle and any like data associated with the vehicle or the vehicle operator In some embodiments, the at least one message may not be visually displayed on the display interface 118 of the message panel 110. In another embodiment, any of the messages stored in the message panel 110 may be accessible through transmission to and deciphering by the control portion 112. In some embodiments, the vehicle messaging system 100 may utilize a Wi-Fi system or similar technology for sending captured information/data and receiving transmitted data from a control portion, and/or server, and/or database.

It may be appreciated by a person with ordinary skill in the art, in light of and in accordance with the teachings of the present invention, that the message plate may be utilized in various environmental conditions and may be typically exposed to the environmental elements, for example, heat, cold, rain, hail, and the like. For example, in embodiments where the message plate is used in extreme temperature conditions, a thermostat portion may be used to monitor the temperature proximal to, and inside the message panel. Accordingly, the thermostat portion may be operatively connected to a heating portion and a cooling portion. In embodiments, where the message plate is used in cold and freezing conditions, the heating portion may be configured to maintain a pre-determined temperature in proximity to the message plate to ensure appropriate working conditions for the message plate. In embodiments, where the message plate is used in heat conditions, a cooling portion may be configured to maintain a pre-determined temperature in proximity to the message plate to ensure appropriate working conditions for the message plate.

It may be appreciated by a person with ordinary skill in the art, in light of and in accordance with the teachings of the present invention, that the message plate may include a maintenance alert system. For example, in an event where extreme temperatures or other hazards may damage the message panel, the maintenance alert system may send an alert to the control portion to indicate need for maintenance or repairs, for example, an expired bulb, a chip, impact damage repair, and the like.

During typical operation, when a message panel 110 encounters a problem, for example, a problem with overheating if the message panel 110 is joined with a vehicle travelling in extreme heat conditions. As described herein, the message panel 110 may include a thermostat that may use a variety of sensors to measure the temperature, commonly a thermistor or a bimetallic strip. The temperature measured by the thermostat may be higher than a predetermined temperature that may allow the message panel 110 to work efficiently. In one embodiment, the thermostat in the message panel may have a maximum switching frequency, or switch heating and cooling portion on and off at temperatures either side of a predetermined temperature and may switch on the cooling portion automatically when the temperature exceeds a predetermined temperature. In another embodiment, the message panel 110 may send the message obtained from the sensors on the thermostat to the control portion 112/server 114. The control portion 112/server 114 may receive the sensor message and execute computer code and/or algorithms from a non-transitory computer readable medium to recognize features from the sensor information and may send a message or instruction to the thermostat to switch on the cooling portion when the temperature exceeds a predetermined temperature. The environmental temperature measured by the thermostat may be displayed on the display interface 118. In certain embodiments, server 114 may access database 116 and search for any resolutions to one or more problems determined from the sensor message. Resolutions may be retrieved from database 116 and sent to the message panel directly or via the control portion 112. The message panel may implement the resolutions to correct the one or more problems determined for the message panel 110. A similar resolution may be obtained when a message is an image captured by the message panel, sensor information on any medical issue with the driver, message for power source change form primary to secondary (described herein below) and vice versa, and the like.

Figure 4:
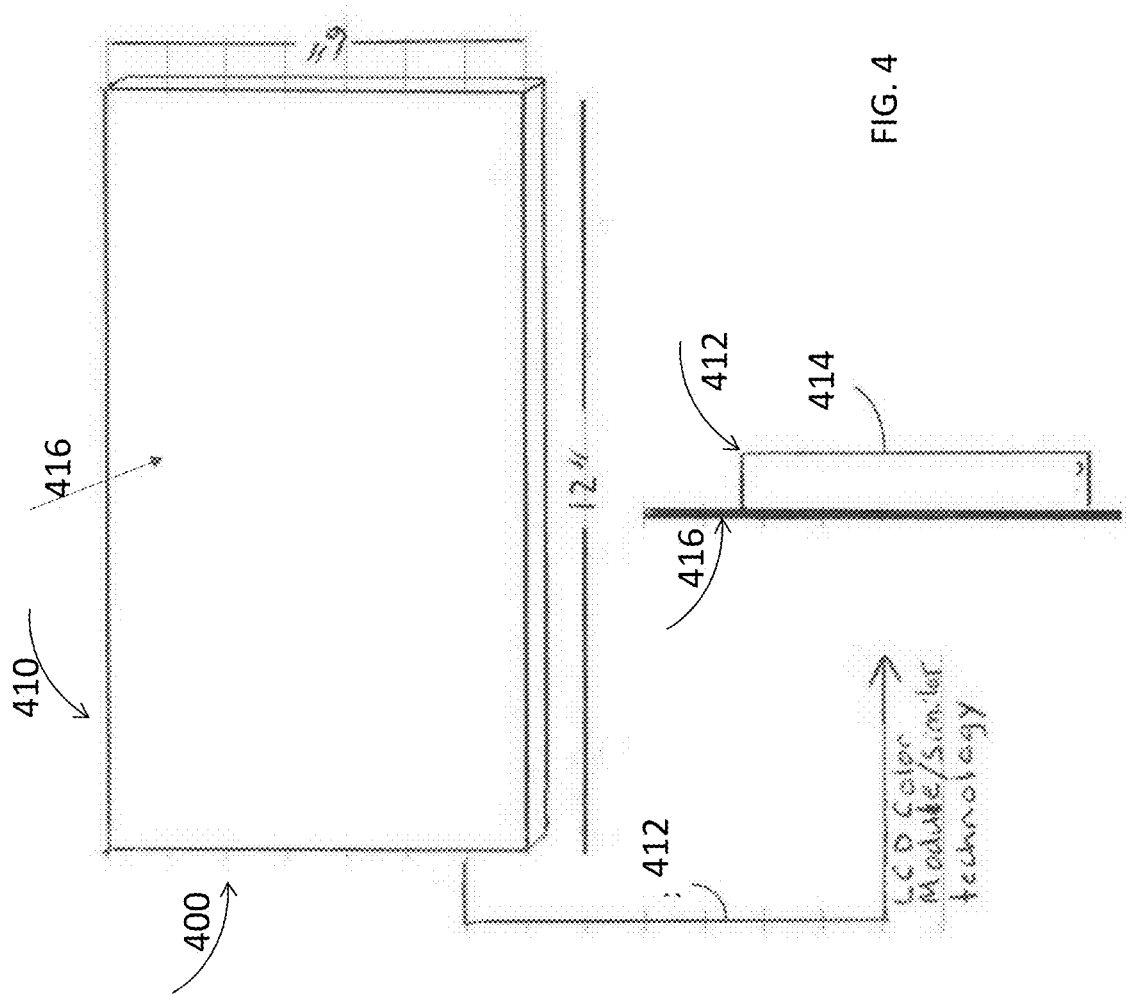
FIG. 4 illustrates an exemplary a message panel in communication with an exemplary circuitry portion, in accordance with an embodiment of the present invention.

Referring to FIG. 4 is illustrated a message panel unit 400, showing a front view 410 and a side view 412. The side view 412 allows viewing of a control panel/circuitry housing 414 of a view screen 416. In the side view 212 the view screen 416 is visible as a line. In one embodiment, the view screen 416 of the message panel may include a digital screen. In various embodiments, the digital screen may include, without limitation, a liquid crystal display (LCD), a light emitting diode (LED), and like display screens. It may be appreciated by a person with ordinary skill in the art, in light of and in accordance with the teachings of the present invention, that an LCD screen may enable the message panel to have thin dimensions. In one embodiment, the digital characteristics of the message panel may be operably coupled (in communication) with the circuitry portion 414. In one embodiment, the message panel 400 and the circuitry portion 414 may be operable coupled using wired connections 412. In another embodiment, the message panel 400 and the circuitry portion 414 may be operable coupled using a wireless connection (not shown in figure). In one embodiment, the circuitry portion 414 may include, without limitation, a circuit board or a computing system. The circuitry portion 414 may be programmed to store, manipulate, and display at least one message on the message panel.

In some embodiments, the message panel may utilize large amounts of power to operate, store the at least one message, transmit the message, display the message, and illuminate the message panel for enhancing the display of the message. in one embodiment, a primary power source for powering the message panel may include a battery from the vehicle. In another embodiment, a secondary power source, for example, a battery (changeable or rechargeable), a solar panel, and the like, may be used to provide power to the message panel. It may be appreciated by a person with ordinary skill in the art, in light of and in accordance with the teachings of the present invention, that the secondary power source may be used, in conjunction with the primary power source or as a back-up power source in place of the primary power source. The secondary power source may thus provide uninterrupted operation of the message panel for extended periods.

In one embodiment, the message panel may be equipped with an electronic adapter allowing it to be connected to an adapter(s) of a vehicle to use the primary source of power, i.e., the vehicle battery.

In some embodiments, the message panel may provide surveillance features. An image capturing device, for example, a camera, may be disposed and operable proximal to the message panel. The image capturing device may be configured to record the license plate of proximal vehicles, other objects in around the rear portion of the vehicle, road conditions and the like. In one embodiment, in the event of an accident, the image capturing device enables the messaging system to capture and retrieve information about the vehicle causing the accident. In one embodiment, the information may be transmitted to the control portion and saved in the control portion. In one embodiment, the information may be transmitted to a sever in communication with the control portion and may be saved in the server or in a database in communication with the server. In some embodiments the messages may be transmitted b an authorized source i.e., computer operator to download new emergency alerts and/or consumer product advertisement.

FIGS. 5A and 5B illustrate front views of an exemplary first enclosure portion for retaining a message panel, where FIG. 5A illustrates a first front panel, and FIG. 5B illustrates a first rear panel, in accordance with an embodiment of the present invention. In essence, the first enclosure portion 500 may form a protective case around the message panel that enables viewing of the at least one message. The first enclosure portion may be configured to protect the message panel from water and air, so that it is water resistant and substantially airtight. The first enclosure portion may be sized larger than the message panel. The first enclosure portion may also comprise at least one vent for enabling passage of air in and out of the message panel. In some embodiments, the message panel may be utilized in various temperatures. In one embodiment, a thermostat portion may be used to monitor the temperature proximal to, and inside the message panel as described hereinabove.

In some embodiments, the first enclosure portion 500 may include a first front panel 502 and a first rear panel 504 that are configured to sandwich the message panel. The first front panel and the first rear panel may be fastened together through at least one first front aperture 510a, 510b that may enable passage of a fastener for joining them together. The first front aperture may have a diameter of about one fourth of an inch. In one embodiment, the fastener may include a security screw having a dimension of about one fourth of an inch.

In some embodiments, the first front panel may include a perimeter portion 508 that surrounds the edges of the message panel. A central open section 506 may enable the message from the message panel to be viewed. In one embodiment, the first front panel has a width of about twelve inches and a height of about six inches, so as to snugly encapsulate the message panel.

In some embodiments, the first rear panel may be configured to fixedly join the enclosure portions and the message panel to the vehicle. At least one first rear aperture 512a, 512b enables passage of a fastener to fasten the components to the vehicle. The first rear aperture may have a diameter of about one fourth of an inch. In one embodiment, the fastener may include a bolt having a dimension of about one fourth of an inch.

Figure 6A:
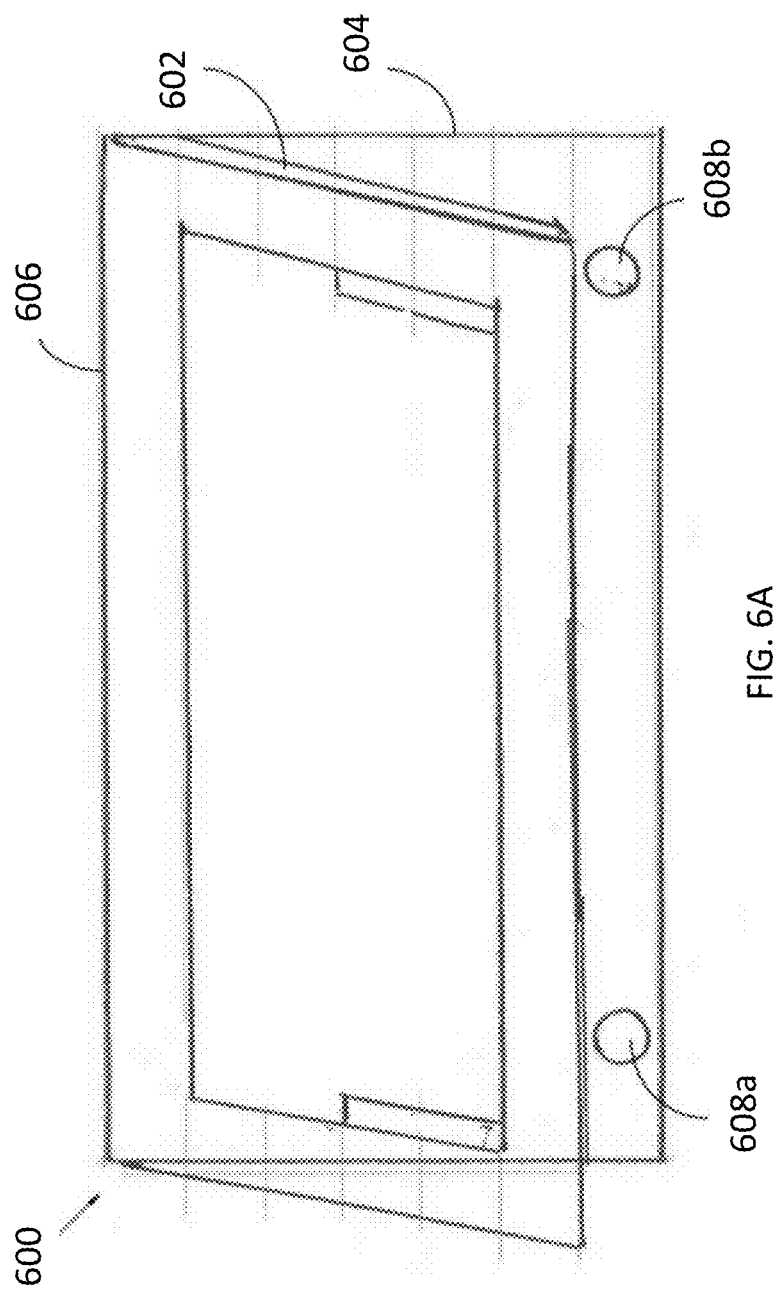

FIGS. 6A and 6B illustrate front views of two different enclosure designs for retaining a message panel, where FIG. 6A illustrates a second front panel, and FIG. 6B illustrates a second rear panel, in accordance with an embodiment of the present invention. FIG. 6A opens from the bottom up, and FIG. 6B opens from the top down. Both enclosure portion designs have rears and tops connected by a hinge mechanism. Specifically, on FIG. 6A, illustrated portion 604 is the rear that will be fastened to the vehicle and 602 is the top of the enclosure. A second enclosure portion 600 may perform substantially the same function as the first enclosure panel. However, the second enclosure portion may hingedly join along an edge portion 606 to enclose or release the message panel. In one embodiment, the edge portion may include a hinge that enables pivoting articulation up to about 180 degrees.

The second enclosure portion may include a second front panel 602 and a second rear panel 604 that are configured to sandwich the message panel. The first front panel and the first rear panel may be fastened together through at least one second front aperture 608a, 608b that enables passage of a fastener for joining them together. The second enclosure portion is configured to securely encase the message panel, the circuitry portion, the heating portion, and the cooling portion. In one embodiment, the second front panel and the second rear panel have a width of about twelve inches and a height of about six inches, so as to snugly encapsulate the message panel.

In yet another embodiment, a third enclosure portion 610 may operate in substantially the same manner, but may only encase the message panel. The other components may be positioned in the vehicle or integrated in the message panel. The third enclosure portion may include a third front panel 612 and a third rear panel 614 that are configured to sandwich the message panel. The third front panel and the third rear panel may be fastened together through at least one third front aperture 616a, 616b that enables passage of a fastener for joining them together. In one embodiment, the third front panel and the third rear panel have a width of about twelve inches and a height of about six inches, so as to snugly encapsulate the message panel. In another embodiment, screws or apertures may be inserted in the third front aperture 616a, 616b (holes) to fasten the rear of the panel to the vehicle. Further, there may be holes on the lower portion of the rear panel 614, that will be aligned with the top holes where screws may be inserted in to secure the enclosure to the vehicle.

Figure 7B:
FIGS. 7A through 7F illustrate examples of various uses of the exemplary message panel, in accordance with an embodiment of the present invention.
Figure 7C:
Figure 7A:
Figure 7E:
Figure 7D:
Figure 7F:

FIGS. 7A through 7F illustrate examples of various uses of the exemplary message panel, in accordance with an embodiment of the present invention. FIG. 7A illustrates how a message panel may capture images in its vicinity, FIG. 7B and FIG. 7C illustrate an advertisement, FIG. 7D illustrates an advertisement, FIG. 7E illustrates a silver alert The driver of a vehicle positioned behind the vehicle displaying the alert may be able to view the information displayed on the digital license plate of the vehicle he/she is trailing and FIG. 7F illustrates the license number of the vehicle In some embodiments, the enclosure portions may provide a tamper resistant component. For example, without limitation, a security screen may selectively cover and uncover the message panel, depending on whether the vehicle is powered on or off. The security screen may automatically close over the message panel when the vehicle is powered off. Conversely, when the vehicle is powered on, the security screen may reopen. Once the vehicle is accelerated or the vehicle operator decelerates, after one full revolution of an advertisement the regular required state information may reappear and remain until such time the vehicle operator applies the brake on the vehicle.

In certain embodiments, anti-theft technologies may be used by the messaging system. The anti-theft technology may include an alarm portion that is operable by a computer chip. The alarm portion may be visible or audible, and may render the message panel inoperable in the event it is removed from the vehicle it is registered to. The alarm portion may also transmit an alarm to appropriate organizations, for example, police, resources/entities and jurisdictions, and state department of motor vehicles (DMV).

In certain embodiments, the message panel may be equipped with positioning systems, for example, GPS technology and the like to track the vehicle's location in the event of theft, locate missing persons and vehicle operators, and the like.

In another exemplary use of the messaging system, the messaging system may boost the economy in a country where it is used because of its ability to perform mass advertisement of consumer products. It may be appreciated by a person with ordinary skill in the art, in light of and in accordance with the teachings of the present invention that typically information available in many existing state DMVs are not digitized and therefore may provide limited information for near instant communication to the public. The DMV and license plates currently issued by the DMVs are often unable to provide emergency alerts i.e., amber alert/silver alerts, stolen car alerts, and the like.

Further, in one embodiment, the required state DMV information may also be permanently marked/etched or painted on the external border of the enclosure so that in the event of power loss or malfunctions, law enforcement may obtain needed information at least as shown in FIG. 7F.

In some embodiments, the message panel may help facilitate a computer or similar technology with Wi-Fi or similar technology or another technology allowing the message panel to be programmable and to receive data transmitted by another computer or similar technology and display the data. The message panel may also receive data through the internet utilizing Wi-Fi and/or satellite technology or any other useful technology enabling it to receive transmitted messages from other computers. The message panel may also be remotely programmable.

In one exemplary use, the message panel may operate a receiver or similar technology allowing it to also receive signals or other channels or types of data from a positioning system, such as a satellite/Global Positioning System (GPS), Star technologies, or future invention for remote data input and programming.

In yet another embodiment, a server/computer/control portion may be utilized to transmit data and commands utilizing the internet and or satellite technologies to the message panel. Subsequently, the message panel may provide slide show like presentations or similar presentations of important public notifications and mass consumer advertisement. In yet another embodiment, the message panel may release information that may be used to program a scheduled display of information and mass advertisement of consumer products.

Those skilled in the art will readily recognize, in light of and in accordance with the teachings of the present invention, that any of the foregoing steps and/or system modules may be suitably replaced, reordered, removed and additional steps and/or system modules may be inserted depending upon the needs of the particular application, and that the systems of the foregoing embodiments may be implemented using any of a wide variety of suitable processes and system modules, and is not limited to any particular computer hardware, software, middleware, firmware, microcode and the like. For any method steps described in the present application that can be carried out on a computing machine, a typical computer system can, when appropriately configured or designed, serve as a computer system in which those aspects of the invention may be embodied.

Those skilled in the art will readily recognize, in light of and in accordance with the teachings of the present invention, that any of the foregoing steps may be suitably replaced, reordered, removed and additional steps may be inserted depending upon the needs of the particular application. Moreover, the prescribed method steps of the foregoing embodiments may be implemented using any physical and/or hardware system that those skilled in the art will readily know is suitable in light of the foregoing teachings. For any method steps described in the present application that can be carried out on a computing machine, a typical computer system can, when appropriately configured or designed, serve as a computer system in which those aspects of the invention may be embodied. Thus, the present invention is not limited to any particular tangible means of implementation.

Figure 8:
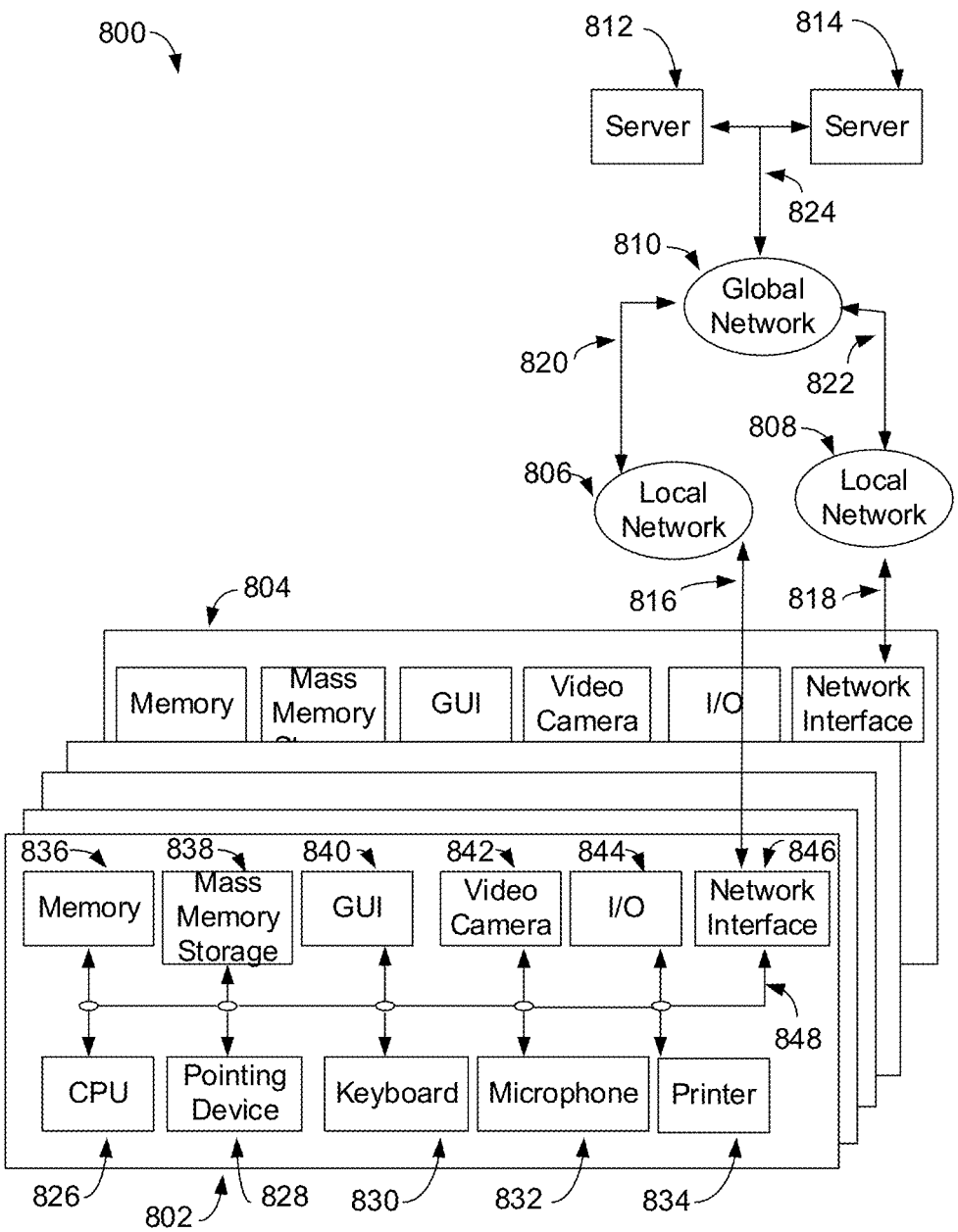
FIG. 8 is a block diagram depicting an exemplary client/server system which may be used by an exemplary web-enabled/networked embodiment of the present invention.

FIG. 8 is a block diagram depicting an exemplary client/server system which may be used by an exemplary web-enabled/networked embodiment of the present invention.

A communication system 800 includes a multiplicity of clients with a sampling of clients denoted as a client 802 and a client 804, a multiplicity of local networks with a sampling of networks denoted as a local network 806 and a local network 808, a global network 810 and a multiplicity of servers with a sampling of servers denoted as a server 812 and a server 814.

Client 802 may communicate bi-directionally with local network 806 via a communication channel 816. Client 804 may communicate bi-directionally with local network 808 via a communication channel 818. Local network 806 may communicate bi-directionally with global network 810 via a communication channel 820. Local network 808 may communicate bi-directionally with global network 810 via a communication channel 822. Global network 810 may communicate bi-directionally with server 812 and server 814 via a communication channel 824. Server 812 and server 814 may communicate bi-directionally with each other via communication channel 824. Furthermore, clients 802, 804, local networks 806, 808, global network 810 and servers 812, 814 may each communicate bi-directionally with each other.

In one embodiment, global network 810 may operate as the Internet. It will be understood by those skilled in the art that communication system 800 may take many different forms. Non-limiting examples of forms for communication system 800 include local area networks (LANs), wide area networks (WANs), wired telephone networks, wireless networks, or any other network supporting data communication between respective entities.

Clients 802 and 804 may take many different forms. Non-limiting examples of clients 802 and 804 include personal computers, personal digital assistants (PDAs), cellular phones and smartphones.

Client 802 includes a CPU 826, a pointing device 828, a keyboard 830, a microphone 832, a printer 834, a memory 836, a mass memory storage 838, a GUI 840, a video camera 842, an input/output interface 844, and a network interface 846.

CPU 826, pointing device 828, keyboard 830, microphone 832, printer 834, memory 836, mass memory storage 838, GUI 840, video camera 842, input/output interface 844 and network interface 846 may communicate in a unidirectional manner or a bi-directional manner with each other via a communication channel 848.

Communication channel 848 may be configured as a single communication channel or a multiplicity of communication channels.

CPU 826 may be comprised of a single processor or multiple processors. CPU 826 may be of various types including micro-controllers (e.g., with embedded RAM/ROM) and microprocessors such as programmable devices (e.g., RISC or SISC based, or CPLDs and FPGAs) and devices not capable of being programmed such as gate array ASICs (Application Specific Integrated Circuits) or general purpose microprocessors.

As is well known in the art, memory 836 is used typically to transfer data and instructions to CPU 826 in a bi-directional manner. Memory 836, as discussed previously, may include any suitable computer-readable media, intended for data storage, such as those described above excluding any wired or wireless transmissions unless specifically noted. Mass memory storage 838 may also be coupled bi-directionally to CPU 826 and provides additional data storage capacity and may include any of the computer-readable media described above. Mass memory storage 838 may be used to store programs, data and the like and is typically a secondary storage medium such as a hard disk. It will be appreciated that the information retained within mass memory storage 838, may, in appropriate cases, be incorporated in standard fashion as part of memory 836 as virtual memory.

CPU 826 may be coupled to GUI 840. GUI 840 enables a user to view the operation of computer operating system and software. CPU 826 may be coupled to pointing device 828. Non-limiting examples of pointing device 828 include computer mouse, trackball and touchpad. Pointing device 828 enables a user with the capability to maneuver a computer cursor about the viewing area of GUI 840 and select areas or features in the viewing area of GUI 840. CPU 826 may be coupled to keyboard 830. Keyboard 830 enables a user with the capability to input alphanumeric textual information to CPU 826. CPU 826 may be coupled to microphone 832. Microphone 832 enables audio produced by a user to be recorded, processed and communicated by CPU 826. CPU 826 may be connected to printer 834. Printer 834 enables a user with the capability to print information to a sheet of paper. CPU 826 may be connected to video camera 842. Video camera 842 enables video produced or captured by user to be recorded, processed and communicated by CPU 826.

CPU 826 may also be coupled to input/output interface 844 that connects to one or more input/output devices such as such as CD-ROM, video monitors, track balls, mice, keyboards, microphones, touch-sensitive displays, transducer card readers, magnetic or paper tape readers, tablets, styluses, voice or handwriting recognizers, or other well-known input devices such as, of course, other computers.

Finally, CPU 826 optionally may be coupled to network interface 846 which enables communication with an external device such as a database or a computer or telecommunications or internet network using an external connection shown generally as communication channel 816, which may be implemented as a hardwired or wireless communications link using suitable conventional technologies. With such a connection, CPU 826 might receive information from the network, or might output information to a network in the course of performing the method steps described in the teachings of the present invention.

Figure 9:
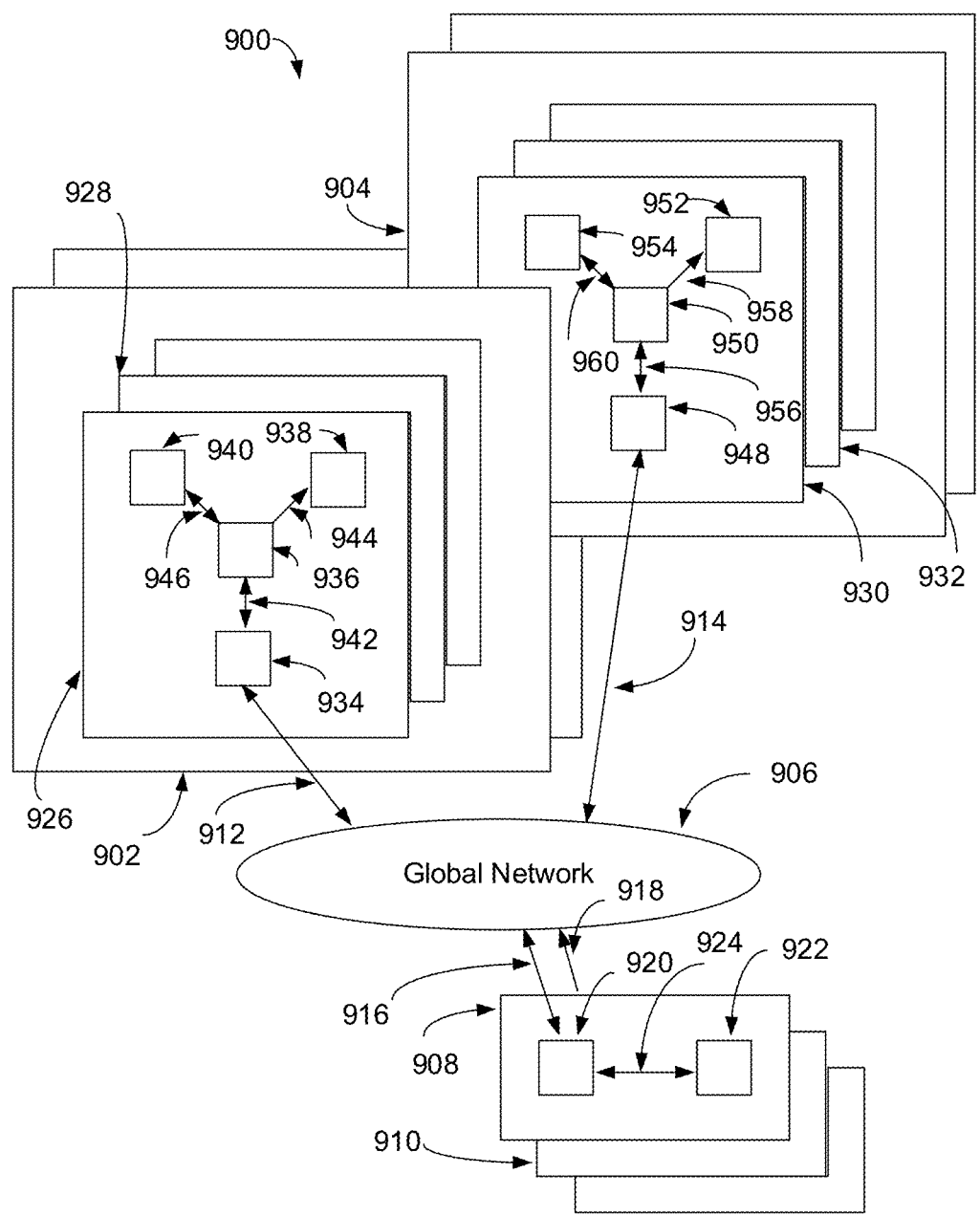
FIG. 9 illustrates a block diagram depicting a conventional client/server communication system.

FIG. 9 illustrates a block diagram depicting a conventional client/server communication system.

A communication system 900 includes a multiplicity of networked regions with a sampling of regions denoted as a network region 902 and a network region 904, a global network 906 and a multiplicity of servers with a sampling of servers denoted as a server device 908 and a server device 910.

Network region 902 and network region 904 may operate to represent a network contained within a geographical area or region. Non-limiting examples of representations for the geographical areas for the networked regions may include postal zip codes, telephone area codes, states, counties, cities and countries. Elements within network region 902 and 904 may operate to communicate with external elements within other networked regions or within elements contained within the same network region.

In some implementations, global network 906 may operate as the Internet. It will be understood by those skilled in the art that communication system 900 may take many different forms. Non-limiting examples of forms for communication system 900 include local area networks (LANs), wide area networks (WANs), wired telephone networks, cellular telephone networks or any other network supporting data communication between respective entities via hardwired or wireless communication networks. Global network 906 may operate to transfer information between the various networked elements.

Server device 908 and server device 910 may operate to execute software instructions, store information, support database operations and communicate with other networked elements. Non-limiting examples of software and scripting languages which may be executed on server device 908 and server device 910 include C, C++, C# and Java.

Network region 902 may operate to communicate bi-directionally with global network 906 via a communication channel 912. Network region 904 may operate to communicate bi-directionally with global network 906 via a communication channel 914. Server device 908 may operate to communicate bi-directionally with global network 906 via a communication channel 916. Server device 910 may operate to communicate bi-directionally with global network 906 via a communication channel 918. Network region 902 and 904, global network 906 and server devices 908 and 910 may operate to communicate with each other and with every other networked device located within communication system 900.

Server device 908 includes a networking device 920 and a server 922. Networking device 920 may operate to communicate bi-directionally with global network 906 via communication channel 916 and with server 922 via a communication channel 924. Server 922 may operate to execute software instructions and store information.

Network region 902 includes a multiplicity of clients with a sampling denoted as a client 926 and a client 928. Client 926 includes a networking device 934, a processor 936, a GUI 938 and an interface device 940. Non-limiting examples of devices for GUI 938 include monitors, televisions, cellular telephones, smartphones and PDAs (Personal Digital Assistants). Non-limiting examples of interface device 940 include pointing device, mouse, trackball, scanner and printer. Networking device 934 may communicate bi-directionally with global network 906 via communication channel 912 and with processor 936 via a communication channel 942. GUI 938 may receive information from processor 936 via a communication channel 944 for presentation to a user for viewing. Interface device 940 may operate to send control information to processor 936 and to receive information from processor 936 via a communication channel 946. Network region 904 includes a multiplicity of clients with a sampling denoted as a client 930 and a client 932. Client 930 includes a networking device 948, a processor 950, a GUI 952 and an interface device 954. Non-limiting examples of devices for GUI 938 include monitors, televisions, cellular telephones, smartphones and PDAs (Personal Digital Assistants). Non-limiting examples of interface device 940 include pointing devices, mousse, trackballs, scanners and printers. Networking device 948 may communicate bi-directionally with global network 906 via communication channel 914 and with processor 950 via a communication channel 956. GUI 952 may receive information from processor 950 via a communication channel 958 for presentation to a user for viewing. Interface device 954 may operate to send control information to processor 950 and to receive information from processor 950 via a communication channel 960.

For example, consider the case where a user interfacing with client 926 may want to execute a networked application. A user may enter the IP (Internet Protocol) address for the networked application using interface device 940. The IP address information may be communicated to processor 936 via communication channel 946. Processor 936 may then communicate the IP address information to networking device 934 via communication channel 942. Networking device 934 may then communicate the IP address information to global network 906 via communication channel 912. Global network 906 may then communicate the IP address information to networking device 920 of server device 908 via communication channel 916. Networking device 920 may then communicate the IP address information to server 922 via communication channel 924. Server 922 may receive the IP address information and after processing the IP address information may communicate return information to networking device 920 via communication channel 924. Networking device 920 may communicate the return information to global network 906 via communication channel 916. Global network 906 may communicate the return information to networking device 934 via communication channel 912. Networking device 934 may communicate the return information to processor 936 via communication channel 942. Processor 946 may communicate the return information to GUI 938 via communication channel 944. User may then view the return information on GUI 938.

It will be further apparent to those skilled in the art that at least a portion of the novel method steps and/or system components of the present invention may be practiced and/or located in location(s) possibly outside the jurisdiction of the United States of America (USA), whereby it will be accordingly readily recognized that at least a subset of the novel method steps and/or system components in the foregoing embodiments must be practiced within the jurisdiction of the USA for the benefit of an entity therein or to achieve an object of the present invention. Thus, some alternate embodiments of the present invention may be configured to comprise a smaller subset of the foregoing means for and/or steps described that the applications designer will selectively decide, depending upon the practical considerations of the particular implementation, to carry out and/or locate within the jurisdiction of the USA. For example, any of the foregoing described method steps and/or system components which may be performed remotely over a network (e.g., without limitation, a remotely located server) may be performed and/or located outside of the jurisdiction of the USA while the remaining method steps and/or system components (e.g., without limitation, a locally located client) of the forgoing embodiments are typically required to be located/performed in the USA for practical considerations. In client-server architectures, a remotely located server typically generates and transmits required information to a US based client, for use according to the teachings of the present invention. Depending upon the needs of the particular application, it will be readily apparent to those skilled in the art, in light of the teachings of the present invention, which aspects of the present invention can or should be located locally and which can or should be located remotely. Thus, for any claims construction of the following claim limitations that are construed under 35 USC § 112 (6) it is intended that the corresponding means for and/or steps for carrying out the claimed function are the ones that are locally implemented within the jurisdiction of the USA, while the remaining aspect(s) performed or located remotely outside the USA are not intended to be construed under 35 USC § 112 (6). In some embodiments, the methods and/or system components which may be located and/or performed remotely include, without limitation all facets of the digital license plate may be either performed in the USA or in any other country whereby vehicles are in use or could one day exist. This may include but not limited to downloading of data, and network programming.

It is noted that according to USA law, all claims must be set forth as a coherent, cooperating set of limitations that work in functional combination to achieve a useful result as a whole. Accordingly, for any claim having functional limitations interpreted under 35 USC § 112 (6) where the embodiment in question is implemented as a client-server system with a remote server located outside of the USA, each such recited function is intended to mean the function of combining, in a logical manner, the information of that claim limitation with at least one other limitation of the claim. For example, in client-server systems where certain information claimed under 35 USC § 112 (6) is/(are) dependent on one or more remote servers located outside the USA, it is intended that each such recited function under 35 USC § 112 (6) is to be interpreted as the function of the local system receiving the remotely generated information required by a locally implemented claim limitation, wherein the structures and or steps which enable, and breath life into the expression of such functions claimed under 35 USC § 112 (6) are the corresponding steps and/or means located within the jurisdiction of the USA that receive and deliver that information to the client (e.g., without limitation, client-side processing and transmission networks in the USA). When this application is prosecuted or patented under a jurisdiction other than the USA, then "USA" in the foregoing should be replaced with the pertinent country or countries or legal organization(s) having enforceable patent infringement jurisdiction over the present application, and "35 USC § 112 (6)" should be replaced with the closest corresponding statute in the patent laws of such pertinent country or countries or legal organization(s).

All the features disclosed in this specification, including any accompanying abstract and drawings, may be replaced by alternative features serving the same, equivalent or similar purpose, unless expressly stated otherwise. Thus, unless expressly stated otherwise, each feature disclosed is one example only of a generic series of equivalent or similar features.

It is noted that according to USA law 35 USC § 112 (1), all claims must be supported by sufficient disclosure in the present patent specification, and any material known to those skilled in the art need not be explicitly disclosed. However, 35 USC § 112 (6) requires that structures corresponding to functional limitations interpreted under 35 USC § 112 (6) must be explicitly disclosed in the patent specification. Moreover, the USPTO's Examination policy of initially treating and searching prior art under the broadest interpretation of a "mean for" claim limitation implies that the broadest initial search on 112(6) functional limitation would have to be conducted to support a legally valid Examination on that USPTO policy for broadest interpretation of "mean for" claims. Accordingly, the USPTO will have discovered a multiplicity of prior art documents including disclosure of specific structures and elements which are suitable to act as corresponding structures to satisfy all functional limitations in the below claims that are interpreted under 35 USC § 112 (6) when such corresponding structures are not explicitly disclosed in the foregoing patent specification. Therefore, for any invention element(s)/structure(s) corresponding to functional claim limitation(s), in the below claims interpreted under 35 USC § 112 (6), which is/are not explicitly disclosed in the foregoing patent specification, yet do exist in the patent and/or non-patent documents found during the course of USPTO searching, Applicant(s) incorporate all such functionally corresponding structures and related enabling material herein by reference for the purpose of providing explicit structures that implement the functional means claimed. Applicant(s) request(s) that fact finders during any claims construction proceedings and/or examination of patent allowability properly identify and incorporate only the portions of each of these documents discovered during the broadest interpretation search of 35 USC § 112 (6) limitation, which exist in at least one of the patent and/or non-patent documents found during the course of normal USPTO searching and or supplied to the USPTO during prosecution. Applicant(s) also incorporate by reference the bibliographic citation information to identify all such documents comprising functionally corresponding structures and related enabling material as listed in any PTO Form-8112 or likewise any information disclosure statements (IDS) entered into the present patent application by the USPTO or Applicant(s) or any 3rd parties. Applicant(s) also reserve its right to later amend the present application to explicitly include citations to such documents and/or explicitly include the functionally corresponding structures which were incorporate by reference above.

Thus, for any invention element(s)/structure(s) corresponding to functional claim limitation(s), in the below claims, that are interpreted under 35 USC § 112 (6), which is/are not explicitly disclosed in the foregoing patent specification, Applicant(s) have explicitly prescribed which documents and material to include the otherwise missing disclosure, and have prescribed exactly which portions of such patent and/or non-patent documents should be incorporated by such reference for the purpose of satisfying the disclosure requirements of 35 USC § 112 (6). Applicant(s) note that all the identified documents above which are incorporated by reference to satisfy 35 USC § 112 (6) necessarily have a filing and/or publication date prior to that of the instant application, and thus are valid prior documents to incorporated by reference in the instant application.

Having fully described at least one embodiment of the present invention, other equivalent or alternative methods of implementing a vehicle messaging system according to the present invention will be apparent to those skilled in the art. Various aspects of the invention have been described above by way of illustration, and the specific embodiments disclosed are not intended to limit the invention to the particular forms disclosed. The particular implementation of the vehicle messaging system may vary depending upon the particular context or application. By way of example, and not limitation, the vehicle messaging system described in the foregoing were principally directed to vehicle messaging system implementations; however, similar techniques may instead be applied to digital displays, which implementations of the present invention are contemplated as within the scope of the present invention. The invention is thus to cover all modifications, equivalents, and alternatives falling within the spirit and scope of the following claims. It is to be further understood that not all of the disclosed embodiments in the foregoing specification will necessarily satisfy or achieve each of the objects, advantages, or improvements described in the foregoing specification.

Claim elements and steps herein may have been numbered and/or lettered solely as an aid in readability and understanding. Any such numbering and lettering in itself is not intended to and should not be taken to indicate the ordering of elements and/or steps in the claims.

The corresponding structures, materials, acts, and equivalents of all means or step plus function elements in the claims below are intended to include any structure, material, or act for performing the function in combination with other claimed elements as specifically claimed.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The Abstract is provided to comply with 37 C.F.R. Section 1.72(b) requiring an abstract that will allow the reader to ascertain the nature and gist of the technical disclosure. That is, the Abstract is provided merely to introduce certain concepts and not to identify any key or essential features of the claimed subject matter. It is submitted with the understanding that it will not be used to limit or interpret the scope or meaning of the claims.

The following claims are hereby incorporated into the detailed description, with each claim standing on its own as a separate embodiment.

The invention claimed is:

1. A system comprising:
a message panel, wherein the message panel is configured to be mounted on a vehicle; the message panel including a heating portion, wherein the heating portion is configured to maintain said message panel at a predetermined temperature, the message panel including a cooling portion, wherein the cooling portion is configured to maintain said message panel at the predetermined temperature;
a thermostat portion having temperature measuring sensors, said thermostat portion operatively connected to the heating portion and cooling portion for monitoring the temperature proximal to and inside the message panel, wherein when the temperature of the thermostat portion varies from the predetermined temperature, the thermostat portion is configured to switch the heating and cooling portions on and off at temperatures which are either side of the predetermined temperature;
a control portion, in operable communication with the message panel, wherein the control portion comprises: a processor, wherein the processor is configured to receive, process, and transmit at least one message transmitted by the message panel, wherein the at least one message is configured to send instructions to the thermostat portion to control the heating and cooling portions and to provide information associated with a vehicle or vehicle operator;
a server, operably coupled with the control portion, wherein the server comprises: a processor, wherein the processor of the server is configured to receive, process and transmit at least one message transmitted by the message panel either directly or via the control portion, wherein the at least one message is configured to send instructions to the thermostat portion to control the heating and cooling portions and to provide information associated with a vehicle or vehicle operator;
a display portion on the message panel configured to display the at least one message; and
a self-learning heuristic processing unit configured to assist in the assimilation of messages and provide a combined response message to be displayed on the display portion on the message panel.

2. The system of claim 1, wherein the message panel comprises a processor, said processor being configured to process, receive, and transmit the at least one message, the at least one message being configured to provide information associated with the vehicle.

3. The system of claim 1, wherein the message panel comprises a secondary power source, wherein the secondary power source is configured to power the message panel.

4. The system of claim 1, wherein the message panel comprises a first enclosure portion, wherein the first enclosure portion, is configured to at least partially encapsulate the message panel for selectively inhibiting engagement of air or water with the message panel.

5. The system of claim 4, Wherein the message panel comprises at least one vent, wherein the at least one vent is configured to enable passage of air in and out of said first enclosure portion.

6. The system of claim 1, wherein the message panel comprises an image capturing device, wherein the image capturing device is configured to enable capturing an image proximal to said message panel.

7. The system of claim 1, wherein the message panel comprises a security screen, wherein the security screen is configured to selectively cover and uncover the message panel, depending on whether said vehicle is powered on or off.

8. The system as in claim 1, wherein the thermostat portion in the message panel has a maximum switching frequency at which time the thermostat portion is configured to trigger the heating portion and the cooling portion.

9. The system as in claim 1, wherein when the temperature of thermostat portion varies from either side of the predetermined temperature, the thermostat portion switches on the heating portion and the cooling portion to reset the message panel at the predetermined temperature.

10. The system as in claim 1, wherein when the thermostat portion temperature measuring sensors detect a variation of the message panel temperature, the control portion and server sends a message to the thermostat portion to switch on the cooling portion when the temperature exceeds the predetermined temperature.

11. A non-transitory computer-readable storage medium with an executable program stored thereon, wherein the program instructs one or more processors to perform the following steps:
providing a vehicle messaging system, wherein the system comprises:
a message panel, wherein the message panel is configured to be mounted on a vehicle; the message panel including a heating portion, wherein the heating portion is configured to maintain said message panel at a predetermined temperature, the message panel including a cooling portion, wherein the cooling portion is configured to maintain said message panel at the predetermined temperature;
a thermostat portion having temperature measuring sensors, said thermostat portion operatively connected to the heating portion and cooling portion for monitoring the temperature proximal to and inside the message panel, wherein when the temperature of the thermostat portion varies from the predetermined temperature, the thermostat portion is configured to switch the heating and cooling portions on and off at temperatures which are either side of the predetermined temperature;
a control portion, in operable communication with the message panel, wherein the control portion comprises: a processor, wherein the processor is configured to receive, process, and transmit at least one message transmitted by the message panel, wherein the at least one message is configured to send instructions to the thermostat portion to control the heating and cooling portions and to provide information associated with a vehicle or vehicle operator; and a server, operably coupled with the control portion, wherein the server comprises: a processor, wherein the processor of the server is configured to receive, process and transmit at least one message transmitted by the message panel either directly or via the control portion, wherein the at least one message is configured to send instructions to the thermostat portion to control the heating and cooling portions and to provide information associated with a vehicle or vehicle operator;

a display portion on the message panel configured to display the at least one message; and a self-learning heuristic processing unit configured to assist in the assimilation of messages and provide a combined response message to be displayed on the display portion on the message panel.

12. The program of claim 11, wherein the message panel comprises a secondary power source, wherein the secondary power source is configured to power the message panel.

13. A message panel comprising:

a thermostat portion having temperature measuring sensors, a heating portion, and a cooling portion, wherein the thermostat portion is operatively connected to the heating portion and the cooling portion to maintain the message panel at a predetermined temperature and for monitoring the temperature proximal to and inside the message panel, wherein when the temperature of the thermostat portion varies from the predetermined temperature, the thermostat portion is configured to switch the heating and cooling portions on and off at temperatures which are either side of the predetermined temperature;

a processor configured to process, receive, and transmit at least one message, the at least one message being configured to provide information associated with the temperature measuring sensors on the thermostat portion and information associated with a vehicle or vehicle operator;

a digital display portion configured to display the at least one message;

a self-learning heuristic processing unit configured to assist in the assimilation of messages sent by the message panel and provide a combined response message to be displayed on the digital display portion on the message panel; and a primary power source and a secondary power source, wherein the secondary power source provides power either in conjunction or in lieu of the primary power source.

14. The message panel of claim 13, wherein the message panel comprises at least one vent, wherein the at least one vent is configured to enable passage of air in and out of a first enclosure portion.

15. The message panel of claim 13, wherein the message panel comprises an image capturing device, wherein the image capturing device is configured to enable capturing an image proximal to said message panel.

16. The message panel of claim 13, wherein the message panel comprises a security screen, wherein the security screen is configured to selectively cover and uncover the message panel, depending on whether said vehicle is powered on or off.

17. The message panel of claim 13, wherein the message panel comprises a positioning system, wherein the positioning system is configured to track a position of said message panel.

18. The message panel of claim 13, wherein the message panel comprises an alarm portion, wherein the alarm portion is configured to initiate an alarm to indicate unauthorized manipulation of the message panel.

19. The message panel as in claim 13, wherein the thermostat portion in the message panel has a maximum switching frequency at which time the thermostat portion is configured to trigger the heating portion and the cooling portion.

20. The message panel as in claim 13, wherein when the temperature of the thermostat portion varies from either side of the predetermined temperature, the thermostat portion switches on the heating portion and cooling portion to reset the message panel at the predetermined temperature.

* * * * *